United States Patent [19]

Herbert

[11] 3,893,037

[45] July 1, 1975

[54] ISOLATING LINEAR AMPLIFIER

[76] Inventor: William L. Herbert, 1405 Inglis Ave., Columbus, Ohio 43212

[22] Filed: Sept. 9, 1973

[21] Appl. No.: 377,708

[52] U.S. Cl. .......................................... 330/59; 330/34

[51] Int. Cl.[2] .......................................... H03F 17/00

[58] Field of Search ........ 330/59, 34; 250/551, 210, 250/209

[56] References Cited

UNITED STATES PATENTS

| | | | |
|---|---|---|---|
| 3,327,239 | 6/1967 | Carpenter | 330/59 |
| 3,433,962 | 3/1969 | Neiger | 330/59 X |
| 3,497,717 | 2/1970 | Barber | 330/59 X |

*Primary Examiner*—Nathan Kaufman
*Attorney, Agent, or Firm*—Frank H. Foster

[57] ABSTRACT

A multistage electrically isolated, optically coupled, amplifier with balanced interstage forward and feedback coupling. A first pair of optical couplers are balance connected to the output of the first stage and the input of the second stage for forward interstage signal coupling. A second pair of optical couplers are balance connected to the output of the second stage and the input of the first stage for feedback signal coupling.

11 Claims, 4 Drawing Figures

ISOLATING LINEAR AMPLIFIER

BACKGROUND

This invention relates generally to a multistage isolating amplifier and more particularly relates to such an amplifier having improved, balanced, optical coupling in both the forward and the feedback loops.

The recent development of optically coupled isolators has stimulated the development of electronic circuits which are electrically isolated and in which the signals are optically coupled. Electrical isolation permits improved safety and protection of the humans who are associated with the electrical equipment.

For example, electronic equipment in a hospital presents increasing hazards for patients and personnel as more complex devices are used for patient care and monitoring. Electrical interaction can occur between such devices as physiological monitoring and other instruments and also between such instruments and patients or personnel. In cardiac monitoring systems, for example, it has been determined that only 20 microamps across the heart muscle can produce lethal microshock.

Similarly, workmen dealing with high voltage systems, such as a high voltage power supply or power transmission lines are quite susceptible to electrical shock. Electrical isolation of high voltage monitoring instrumentation could protectively isolate such workmen from these hazards.

Although electrical isolation is recognized as being desirable for safety purposes, it is also recognized that electronic circuits and equipment require certain basic characteristic qualities in order to adequately perform. For example, it is necessary that isolated amplifiers exhibit the same desirable characteristics as sought after in designing conventional amplifier circuits. For example, suitable linearity and bandwidth are needed for processing analog signals.

It is therefore an object of the invention to provide an optically coupled amplifier system exhibiting high quality linearity characteristics from dc to megahertz frequencies.

Another object of the invention is to provide such an amplifier which features optically coupled negative or positive feedback.

Another object of the invention is to provide such a linear, isolated amplifier which is readily suitable for reduction to thin film or integrated circuit construction.

Further objects and features of the invention will be apparent from the following specification and claims when considered in connection with the accompanying drawings illustrating several embodiments of the invention.

SUMMARY

The invention is a multistage, isolating amplifier including an improved coupling circuit for coupling a signal from the output of a first amplifier stage to the input of another amplifier stage with electrical isolation between the amplifier stages. The improvement has an electrically isolated power supply associated with each amplifier stage, each supply having a common terminal connected to a common terminal of its associated amplifier stage and having a relatively positive terminal and a relatively negative terminal.

The coupling means comprises a pair of optical couplers having their photo emissive input element in series balanced connection between the relatively positive and negative supply terminals associated with said one amplifier stage for permitting a quiescent current flow through the input elements and having the output of the one amplifier stage connected intermediate the input elements. The optical couplers also have their photo responsive elements in series balanced connection between the relatively positive and negative terminals of the power supply associated with the other amplifier stage for permitting a quiescent current flow through said output elements and having the input of said other amplifier stages connected intermediate the output elements.

Figure 1:
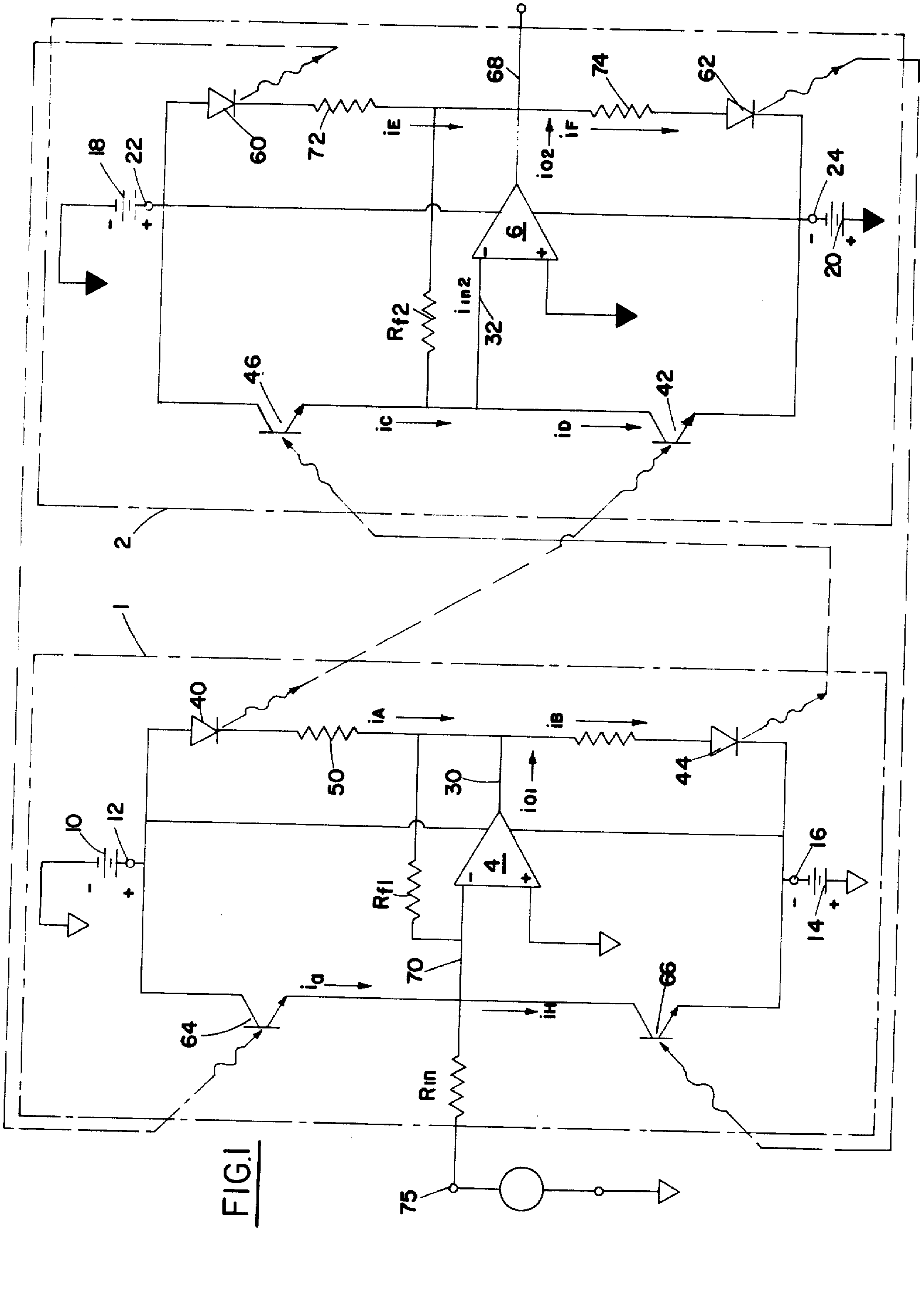
FIG. 1 is a schematic diagram of a relatively simple preferred embodiment of the invention.

In describing the preferred embodiment of the invention illustrated in the drawings, specific terminology will be resorted to for the sake of clarity. However it is not intended to be limited to the specific terms so selected and it is to be understood that each specific term includes all technical equivalents which operate in a similar manner to accomplish a similar purpose. For example, it is very important that the term "connection" is not limited to direct connection but may include connection through other elements such as resistors where such a connection would be considered equivalent for purposes of the invention by those skilled in the art.

DETAILED DESCRIPTION

FIG. 1 illustrates a multistage, isolating, linear amplifier constructed according to the present invention. This amplifier has a first or prior stage 1 followed by a second or subsequent stage 2. Each stage includes an op-amp 4 and 6 conventionally connected with their noninverting inputs connected to a common and with feedback resistances $R_{F1}$ and $R_{F2}$ respectively in order to operate as conventional linear amplifiers.

An electrically isolated power supply is associated with each amplifier stage. Each such power supply has a common terminal connected to a common terminal of its associated amplifier stage and has both a relatively positive terminal and a relatively negative terminal.

For example, the first stage 1 is provided with a negatively grounded battery 10 having its positive terminal 12 forming the relatively positive terminal of the first stage 1. Similarly, the first stage 1 has another battery 14 positively grounded and having its negative terminal 16 forming the relatively negative terminal of the first stage 1. In a like manner, the batteries 18 and 20 provide the relatively positive terminal 22 and the relatively negative terminal 24 for the second stage 2. As can be seen from the schematic, the op-amps themselves are also conventionally supplied by these same power supplies.

Generally described, the output of the first stage 1 is forward coupled to the input of the second stage 2 by a pair of optical couplers having their photo emissive input elements in series balanced connection between the relatively positive terminal 12 and the relatively negative terminal 16 associated with the first stage 1 for permitting a quiescent current flow through these input elements. The output terminal 30 of the amplifier 4 is connected intermediate these input elements. The same optical couplers also have their photo responsive output elements in series balanced connection between the relatively positive terminal 22 and the relatively negative terminal 24 of the power supply associated with the second stage 2 for permitting a quiescent current flow through the output elements and having the input terminal 32 of the second amplifier 6 connected intermediate the output elements. A feedback path from the output of the second stage 2 to the input of the first stage 1 is provided by a similar coupling means which comprises a similarly connected pair of optical couplers.

More specifically, a light emitting diode 40 is optically coupled to a photo transistor 42 to form one optical coupler of the forward coupling means. Similarly, a light emitting diode 44 is optically coupled to a photo transistor 46 to form the other optical coupler of the forward coupling means. A pair of biasing resistances 50 and 52 are series connected with the light emitting diodes 42 and 44 and the output terminal 30 of the amplifier 4 is connected therebetween.

For purposes of the present invention, the biasing resistances for each amplifier stage are considered to be a part of the coupler because the particular biasing arrangement is dependant in part upon the operating characteristics of the particular optical coupler being used and the bias desired. As will be seen the coupler is always in balanced connection to the amplifier stage. The load seen by the op-amps therefore is the impedance presented by the entire coupler circuit connected to it.

Phototransistors 42 and 46 are in similar balanced connection with the relatively positive terminal 22 and the relatively negative terminal 24 of the second stage 2. The input 32 of the amplifier 6 is connected intermediate the phototransistors 42 and 46.

Similarly, light emitting diodes 60 and 62 are optically coupled to phototransistors 64 and 66 respectively for coupling a feedback signal from the output 68 of the amplifier 6 to the inverting input 70 of the amplifier 4. This feedback coupling path includes biasing resistances 72 and 74 which are analogous to the biasing resistances 50 and 52 of the first stage. The signal input terminal 75 of the first stage 1 is connected by an input resistance $R_{IN}$ to the inverting input 70 of the op-amp 4.

For purposes of the present invention the term optical coupler is not limited to devices which are coupled by light in the visible range but is intended to include other devices having similar characteristics. For example, the term optical coupler is intended to include devices operating in the infra-red region. An optical coupler is considered to inherently include a photo emissive element which emits light of some frequency and a photo responsive element optically coupled to the photo emissive element which responds to the emitted light.

The operation of the preferred embodiment of the invention illustrated in FIG. 1 may first be considered with the circuit in a balanced quiescent condition. In such a condition, the input terminal 75 to the amplifier 4 may be considered to have applied thereto 0 volts, i.e., it is grounded. In this condition the output 30 of the op-amp 4 will be at ground potential and the quiescent current $i_A$ through the light emitting diode 40 and the associated biasing resistance 50 will equal the quiescent current $i_B$ through the light emitting diode 44 and the biasing resistance 52. Therefore, the circuit is in balance and there will be substantially no output current $i_{01}$ at the output of the amplifier 4.

In this quiescent condition the light emitted from light emitting diodes 40 and 44 will be equal and consequently, the collector to emitter cirrent $i_C$ and $i_D$ of the balance connected phototransistors 42 and 46 willl be equal. The input current is balanced and the voltage at the input 32 of op-amp 6 will be ground potential.

The input voltage of the amplifier 6 will consequently be zero and therefore its output potential at the output terminal 68 will be at ground potential. Therefore the currents $i_E$ and $i_F$ through the light emitting diodes 60 and 62 under these quiescent conditions will be equal. This in turn will cause equal output collector to emitter currents $i_G$ and $i_H$ in the collector circuits of the phototransistors 64 and 66. This results in a balanced, ground potential condition at the input 70 of the amplifier 4.

Therefore, it can be seen that under quiescent conditions, the entire circuit is balanced with the inputs and outputs to all stages resting at ground potential.

If now, we consider the attachment of a small signal generator at the input terminal 75 of the first stage 1, we can consider the result of voltage excursions about this ground potential. A positive voltage excursion at the input 75 will cause a negative going excursion of the output 30 of the amplifier 4. This will produce an increase of current $i_A$ through light emitting diode 40 and a decrease of current $i_B$ through light emitting diode 44. The difference in current $i_A$ and $i_B$ will be substantially the current $i_{01}$ at the op-amp 4 output 30 according to Kirchhoff's current law.

The resulting current imbalance in the light emitting diodes 40 and 44 will produce a corresponding imbalance in the collector circuit currents $i_C$ and $i_D$ of the phototransistors 42 and 46 so that the current $i_D$ will become significantly greater than the current $i_C$. The difference current will flow primarily through the resistor $R_{F2}$ (with only a relatively insignificant current input current to the op-amp 6). The impedance imbalance will cause enough voltage imbalance of the input 32 of op-amp 6 to cause a positive going voltage excursion at the output 68 of the amplifier 6. Therefore the output is in phase with the input.

The positive going excursion of the output 68 similarly increases the current $i_F$ in the light emitting diode 62 while decreasing the current $i_E$ through the light emitting diode 60. This in turn reduces the impedance of phototransistor 66 while increasing the impedance of phototransistor 64 producing a net imbalance of the feedback circuit directed oppositely of the original input excursion at the input terminal 75. The circuit consequently exhibits negative feedback. Clearly, positive feedback could be provided if the light emitting diode 60 were optically coupled to phototransistor 66 with the light emitting diode 62 optically coupled to phototransistor 64.

For a negative going excursion, the circuit becomes imbalanced in the opposite directions with analogous results occurring.

Figure 2:
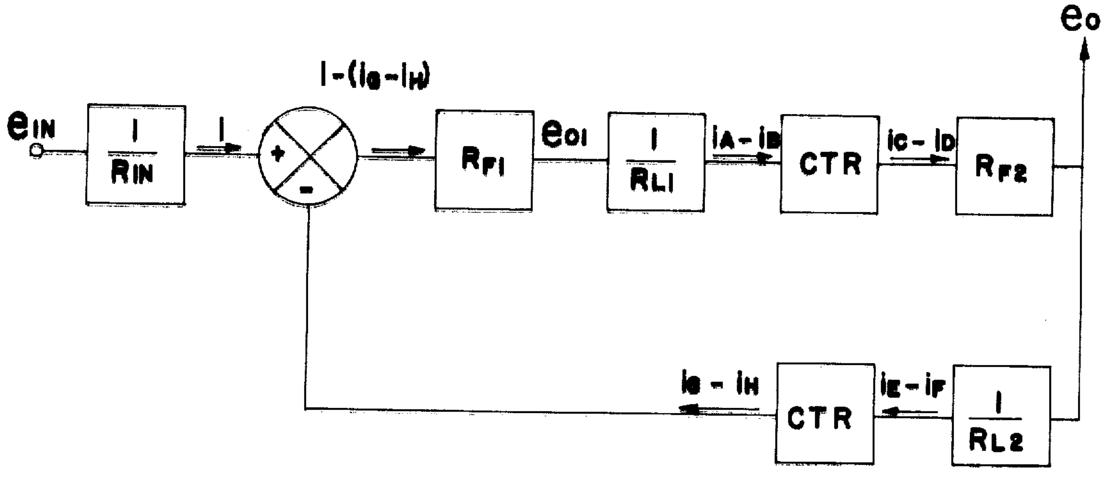
FIG. 2 is a closed loop block diagram illustrating the transfer functions of the preferred embodiment of the invention.

FIG. 2 represents the embodiment of FIG. 1 in a conventional closed loop block diagram for determining the small signal, low frequency operation of this circuit. The biasing resistance value $R_{L1}$ must of course, be substantially the parallel combination of resistances 50 and 52 as is appropriate for the AC equivalent circuit. Similarly, the biasing resistance $R_{L2}$ will be the parallel combination of resistances 72 and 74. The term CTR represents the coupler transfer ratio and for the couplers shown would be the collector current transfer ratio which may be defined as the ratio of the collector current to the input diode current.

An amplifier constructed according to the present invention can include several stages such as those illustrated in FIG. 1. Additionally, feedback coupling could be provided between any subsequent stage and any prior stage. For example, there could be four cascaded stages coupled by the coupling means of the present invention in the forward direction with feedback coupling according to the present invention from the last stage to the first stage. Additionally, or alternatively, feedback coupling could be provided between intermediate stages.

There are many equivalent combinations of optical couplers which can be used in an embodiment of the invention. For example, both the photoemissive element and the photoresponsive element of each coupler could be a diode. This would be advantageous for high frequency applications. Additionally, the input photoemissive elements could be driven by a conventional transistor and similarly the photoresponsive output elements could be used for controlling a conventional transistor for improving the gain of the coupling circuitry. The coupling circuitry could also include incandescent or other types of photoemissive circuit elements and photoresistors or other types of photoresponsive elements. Although there are a great multitude of such circuits which will now become apparent to those skilled in the art it is intended for the purposes of the present invention that any such circuit together with its biasing arrangements and loading arrangements for the amplifier stages, be considered, as a whole, a coupling circuit.

Optical couplers of many types are available for use with the present invention. For example, the Monsanto photodiode optoisolator MCD2 may be used where a photodiode optically coupled to a light emitting diode is desired. Alternatively, the Fairchild optically coupled isolator FCD811 or FCD820 provides an infrared emitting diode optically intercoupled to a phototransistor.

The present invention also lends itself well to optical coupling through various types of light paths including air or vacuum and is particularly well suited for the coupling now known in the field of fiber optics.

By selection of the forward and feedback coupling paths the output can be inverted or non-inverted and for each case either negative or positive feedback can be provided.

It should also be noted that the amplifier circuit within each stage can in fact be any amplifier, including conventional amplifiers, which can cause light emission variations in light emitting devices. Of course, as will be obvious to those skilled in the art, the amplifier itself within each stage could be a multiple stage amplifier having its own feedback system according to conventional practice.

Figure 3:
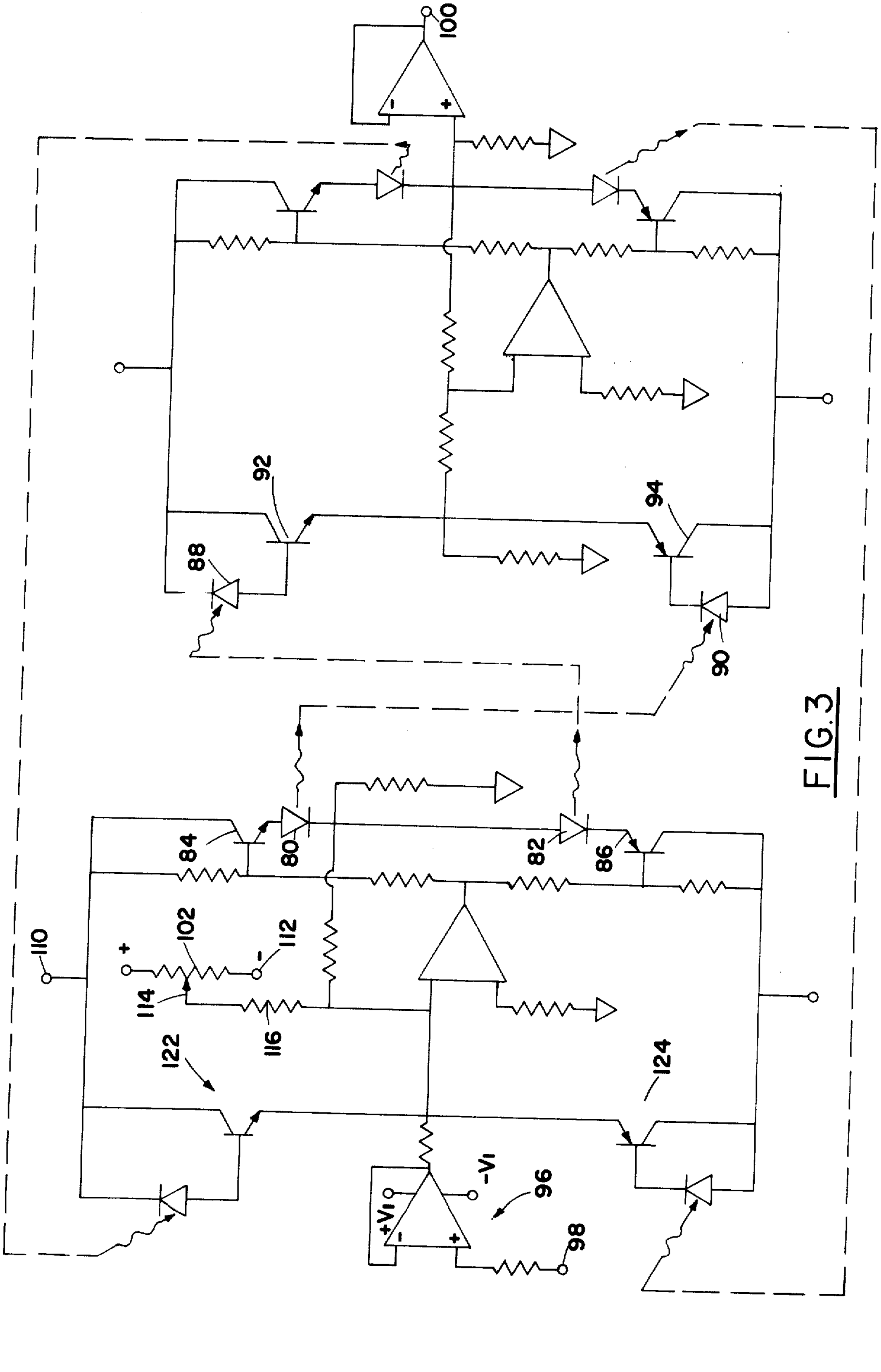
FIG. 3 is a schematic diagram of a more complex embodiment of the invention.

FIG. 3 illustrates an alternative embodiment of the invention which contains several alternatively available features. For example, light emitting diodes 80 and 82 are driven by complementary transistors 84 and 86. Similarly, photoresponsive diodes 88 and 90 are used for controlling complementary transistors 92 and 94. The use of such transistors permits the high frequency response available from diodes and yet improves the coupled gain.

The embodiment of FIG. 3 also has an impedance matching amplifier circuit 96 utilized to provide a high impedance input terminal 98. In order that the quiescent output voltage at the output terminal 100 can be adjusted to zero under quiescent conditions, an adjustable biasing means 102 is provided for selectively adjusting the output 100 to ground potential or any other desired output condition with the input terminal 98 connected to ground potential. The preferred adjustable biasing means comprises an adjustable voltage divider which is connected between the relatively negative and relatively positive terminals 110 and 112 and has its movable wiper 114 resistively connected to an intermediate node of one of the coupling means. In FIG. 3, the movable wiper 114 is connected to the node 120 intermediate the photoresponsive element 122 and the photoresponsive element 124 of the feedback coupling means. It can be seen that any one of these alternative modifications or groups of such modifications may be adapted for use in the various types of circuitry suggested by this description of the preferred embodiments of the invention.

Figure 4:
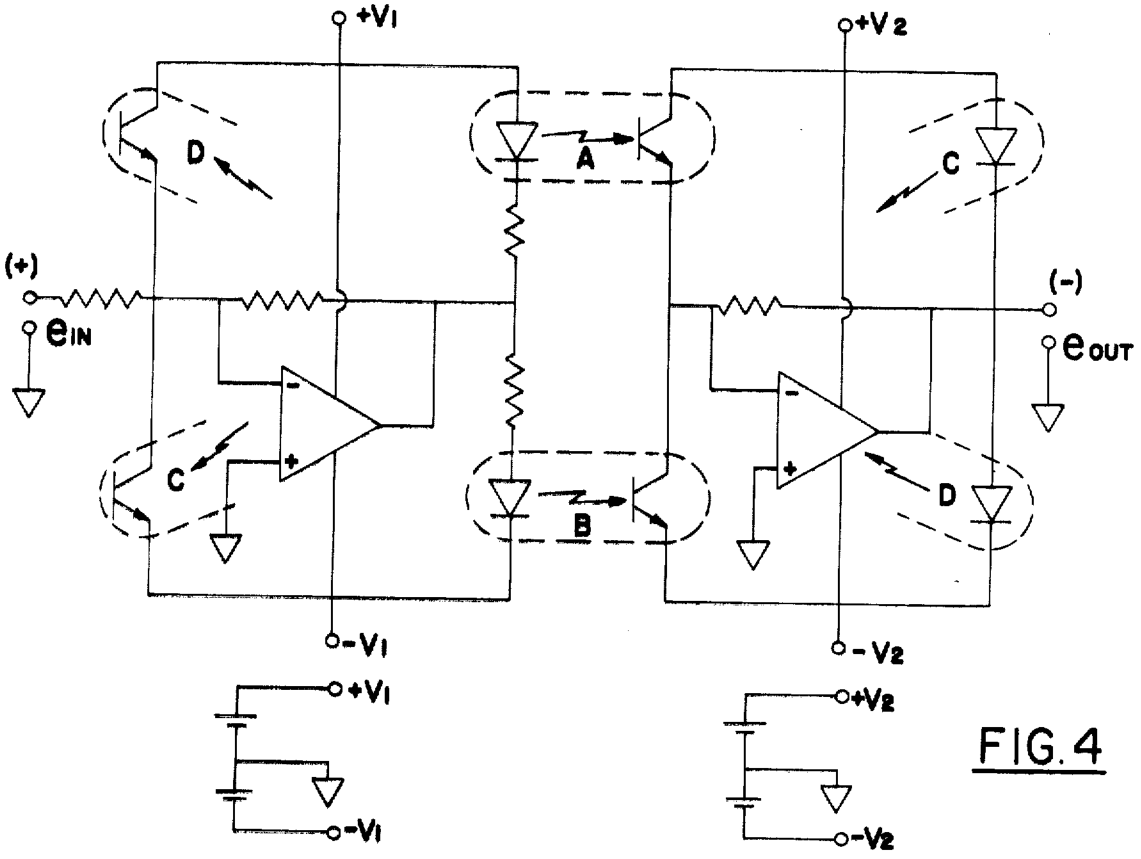
FIG. 4 is a schematic diagram of an alternative inverting embodiment of the invention.

FIG. 4 is a relatively simple circuit and is included as an example of an embodiment of the invention in which the output is inverted from its input phase.

It is to be understood however, that while the detailed drawings and specific examples given describe preferred embodiments of the invention, they are for the purposes of illustration only, that the apparatus of the invention is not limited to the precise details and conditions disclosed and that various changes, including those described may be made therein without departing from the spirit of the invention which is defined by the following claims.

What is claimed is:

1. A multistage isolating amplifier including an improved circuit for applying a signal from the output of a first amplifier stage to the input of a second amplifier stage with electrical isolation between said amplifier stages, wherein the improvement comprises:

a. at least two electrically isolated power supplies, a different supply connected to said first amplifier stage and said second amplifier stage respectively, each supply having a common terminal connected to a common terminal of its respective amplifier stage and having a positive terminal and a negative terminal; and b. a signal applying means for applying a signal from the output of said first amplifier stage to the input of said second amplifier stage, said signal applying means comprising a pair of optical couplers having their photoemissive elements in series connection between the positive and negative supply terminals of the power supply connected to said first amplifier stage for permitting a quiescent current flow through said photoemissive elements and having the output of said first amplifier stage connected intermediate said photoemissive elements, said optical couplers also having their photoresponsive elements in series connection between the positive and negative terminals of the power supply connected to said second amplifier stage for permitting a quiescent current flow through said photoresponsive elements and having the input of said second amplifier stage connected intermediate said photoresponsive elements.

2. An improved multistage isolating amplifier having multiple cascaded amplifier stages and including:

a. a forward signal coupling means for coupling the output signal of a first amplifier stage to the input of an amplifier stage which is subsequent to said first amplifier stage, said first stage and said subsequent stage each having a respective power supply, each power supply having a common terminal connected to a common terminal of its respective amplifier stage and each power supply having a positive terminal and a negative terminal, said coupling means comprising a first pair of optical couplers having their photoemissive elements in series connection between the positive and negative terminals of the power supply connected to said first amplifier stage for permitting a quiescent current flow through said photoemissive elements of said first pair of optical couplers and having the output of said first amplifier stage connected intermediate said photoemissive elements of said first pair of optical couplers, said first pair of optical couplers also having their photoresponsive elements in series connection between the positive and negative terminals of the power supply connected to said subsequent amplifier stage for permitting a quiescent current flow through said photoresponsive elements of said first pair of optical couplers and having the input of said subsequent amplifier stage connected intermediate said photoresponsive elements of said first pair of optical couplers; and b. a feedback circuit means for applying the output signal of one of the amplifier stages of said multistage amplifier to the input of an amplifier stage which is prior to said one amplifier stage, said one amplifier stage and said prior stage each having a respective power supply, each power supply having a common terminal connected to a common terminal of its respective amplifier stage and each power supply having a positive terminal and a negative terminal, said feedback circuit means comprising a second pair of optical couplers having their photoemissive elements in series connection between the positive and negative terminals of the epower supply connected to said one amplifier stage for permitting a quiescent current flow through said photoemissive elements of said second pair of optical couplers and having the output of said one amplifier stage connected intermediate said photoemissive elements of said second pair of optical couplers, said second pair of optical couplers also having their photoresponsive elements in series connection between the positive and negative terminals of the power supply connected to said prior amplifier stage for permitting a quiescent current flow through said photoresponsive elements of said second pair of optical couplers and having the input of said prior amplifier stage connected intermediate said photoresponsive elements of said second pair of optical couplers.

3. An amplifier according to claim 2 wherein said amplifier stages each comprises an op-amp having biasing means wherein, under quiescent conditions, the outputs and inputs of said op-amps are substantially at a ground potential intermediate the potentials of said relatively positive and negative terminals and have substantially no input or output current.

4. An amplifier according to claim 3 wherein an adjustable biasing means is provided for selectively adjusting said amplifier to a desired quiescent output condition.

5. An amplifier according to claim 4 wherein said adjustable biasing means comprises an adjustable voltage divider connected across said relatively negative and positive terminals and having its movable member resistively connected to an intermediate node of one of said coupling means.

6. An amplifier according to claim 2 wherein the optical couplers of at least one coupling means each comprises a light emitting diode coupled to a photo transistor.

7. An amplifier according to claim 6 wherein said light emitting diode is driven by a transistor.

8. An amplifier according to claim 2 wherein the optical couplers of at least one of said coupling means comprises a light emitting diode and a photo diode.

9. An amplifier according to claim 8 wherein said light emitting diode is driven by a transistor.

10. An amplifier according to claim 8 wherein said photo diode is connected to a second transistor for controlling said second transistor.

11. An amplifier according to claim 10 wherein said light emitting diode is driven by a transistor.

* * * * *